(12) United States Patent
Zhang et al.

(10) Patent No.: US 8,847,084 B2
(45) Date of Patent: Sep. 30, 2014

(54) INSULATING SPACER WITH BUILT-IN OPTICAL FIBER

(75) Inventors: Wei Zhang, Hitachi (JP); Masashi Kawamata, Hitachi (JP); Tatsushi Yamaguchi, Saitama (JP); Daigorou Shiozawa, Kitakatushika (JP)

(73) Assignee: Hitachi, Ltd., Tokyo (JP)

( * ) Notice: Subject to any disclaimer, the term of this patent is extended or adjusted under 35 U.S.C. 154(b) by 133 days.

(21) Appl. No.: 13/634,699

(22) PCT Filed: Mar. 8, 2011

(86) PCT No.: PCT/JP2011/055871
§ 371 (c)(1),
(2), (4) Date: Sep. 13, 2012

(87) PCT Pub. No.: WO2011/115026
PCT Pub. Date: Sep. 22, 2011

(65) Prior Publication Data
US 2013/0025933 A1    Jan. 31, 2013

(30) Foreign Application Priority Data
Mar. 19, 2010    (JP) ................................. 2010-063556

(51) Int. Cl.
H05K 7/14    (2006.01)
H02B 13/035    (2006.01)
G01R 15/24    (2006.01)
H02G 5/06    (2006.01)

(52) U.S. Cl.
CPC .......... *G01R 15/246* (2013.01); *H02B 13/0356* (2013.01); *H02G 5/066* (2013.01)
USPC ........... 174/535; 174/14 R; 174/28; 174/99 B

(58) Field of Classification Search
CPC .............................. G01R 15/246; H02G 5/066
USPC ......... 174/70 R, 14 R, 16.2, 28, 17 GF, 99 B; 361/604, 605, 611, 612
See application file for complete search history.

(56) References Cited

U.S. PATENT DOCUMENTS 3,652,778 A * 3/1972 Sakai ............................... 174/28
4,552,989 A * 11/1985 Sass ............................... 174/103
(Continued)

FOREIGN PATENT DOCUMENTS

| CN | 101354409 A | 1/2009 |
| CN | 101393308 A | 3/2009 |

(Continued)

OTHER PUBLICATIONS

Corresponding International Search Report with English Translation dated Apr. 26, 2011 (five (5) pages).

(Continued)

*Primary Examiner* — Lisa Lea Edmonds
*Assistant Examiner* — Keith Depew
(74) *Attorney, Agent, or Firm* — Crowell & Moring LLP

(57) ABSTRACT

Insulating spacer 1 has insulating molded member 3 molded as a single body with insulating material such as epoxy resin, in which at least one electric conductor 2, a grounding shield surrounding the electric conductor(s), and Optical fiber 14 of Faraday-effect element are embedded to form a build-in configuration. The grounding shield can be formed of cylindrical shielding member 15 made of metal wires, metal strips, or a cylindrical metallic member having a perforation of a plurality of small holes thereon. The aforementioned optical fiber 14, which is to be used as a component of an optical current transformer, is put in a certain place in cylindrical shielding member 15.

5 Claims, 5 Drawing Sheets

(56) References Cited

U.S. PATENT DOCUMENTS

| | | | |
|---|---|---|---|
| 5,554,236 A * | 9/1996 | Singles et al. | 156/52 |
| 5,723,813 A * | 3/1998 | Ito et al. | 174/28 |
| 6,268,562 B1 * | 7/2001 | Yokoyama et al. | 174/541 |
| 7,339,680 B2 * | 3/2008 | Bohnert et al. | 356/483 |
| 7,834,270 B2 * | 11/2010 | Zhu et al. | 174/105 R |
| 8,598,459 B2 * | 12/2013 | Eshima | 174/102 R |
| 2006/0254801 A1 * | 11/2006 | Stevens | 174/102 R |
| 2010/0116541 A1 * | 5/2010 | Eshima | 174/388 |

FOREIGN PATENT DOCUMENTS

| | | | | |
|---|---|---|---|---|
| JP | 3-189568 A | | 8/1991 | |
| JP | 7-16171 U | | 3/1995 | |
| JP | H0716171 | * | 3/1995 | G01R 19/00 |
| JP | 7-191062 A | | 7/1995 | |
| JP | 8-178987 A | | 7/1996 | |
| JP | 10-142265 A | | 5/1998 | |
| JP | 2000-217215 A | | 8/2000 | |

OTHER PUBLICATIONS

Form PCT/ISA/237 (three (3) pages).
Notification of Transmittal of Translation of the International Preliminary Report on Patentability (PCT/IB/338) and International Preliminary Report on Patentability (PCT/IB/373), including English-language Written Opinion (PCT/ISA/237) dated Nov. 1, 2012 (five (5) pages).
Chinese Office Action dated Mar. 26, 2014 {Six (6) pages}.

* cited by examiner

INSULATING SPACER WITH BUILT-IN OPTICAL FIBER

TECHNICAL FIELD

The present invention relates to an insulating spacer with built-in optical fiber particularly to such an insulating spacer with built-in optical fiber as includes an optical fiber for use in an optical current transformer for measuring electrical current.

BACKGROUND ART

A gas insulated switchgear (hereinafter referred to as "GIS") has such a construction that, in coupling a plurality of cylindrical containers in which high-voltage electric conductors or various high-voltage apparatuses are accommodated, sealed compartments are formed using disk-shaped insulating spacers formed from insulating material such as epoxy resin and each of the sealed compartments of the cylindrical container is filled with insulating gas.

For the measuring of current flowing through the electric conductors in the cylindrical container, a GIS uses a wound-type current transformer or an optical current transformer that uses an optical fiber having Faraday-effect. Since small sizing and weight reducing is a requirement of a GIS, use of the current transformer particularly considers employing an optical current transformer, which offers size reduction to a larger degree compared with a wound-type current transformer. As a current transformer for GIS use, an optical current transformer that Japanese Patent Laid-open Application No. Hei 10-142265 (Patent literature 1) describes is known.

The optical current transformer described in Patent literature 1 is installed in a manner as follows: In coupling a plurality of cylindrical tanks having flanges for connection, a three-phase insulating spacer of insulating material that has electric conductors for three phases is disposed between the flanges in a sandwiched manner. In this three-phase insulating spacer, optical fibers of Faraday-effect element to form optical paths for light transmission and light reception are embedded severally surrounding each of the three-phase electric conductors.

On the optical fiber for light transmission, a setup of devices for the light transmission side, comprised of a light source, a polarizer, and other related elements, is arranged outside the tank; and likewise on the optical fiber for light reception, a setup of devices for the light reception side (detector side), comprised of an analyzer, a measuring instrument, and other related elements, is arranged outside the tank. Thereby, an optical current transformer is formed. In the optical current transformer, a linearly polarized light is injected into the optical path from the light emission side for transmission, and at the detector side, the transmitted light is detected and measured for its Faraday rotation angle, magnitude of which is dependent on the intensity of action of magnetic field generated by current flowing through the electric conductor, and thereby the magnitude of the current in the electric conductor is determined.

On the other hand, a zero-phase current transformer for gas insulated electrical apparatuses has been disclosed in Japanese Laid-open Patent Application No. Hei 8-178987 (Patent literature 2). The configuration of this zero-phase current transformer is as follows: An optical fiber of Faraday-effect element is embedded in a three-phase insulating spacer having electric conductors for three-phase, encircling all the electric conductors of three-phase in one lump over the zero-phase current detection section of such electric conductors. On each end of the optical fiber, a setup of devices for the light transmission side and a setup of devices for the light reception side are severally arranged. Thereby, the zero-phase current is determined based on the polarization signal outputted through the optical fiber.

The optical current transformer described in Patent literature 1 stated above uses such an insulating spacer that optical fibers are embedded therein severally surrounding the electric conductor of each phase; and the zero-phase current transformer described in Patent literature 2 uses an insulating spacer that an optical fiber is embedded therein surrounding all the electric conductors of three-phase in one lump. These insulating spacers are manufactured using, in general, insulating material such as epoxy resin.

Usually, an insulating spacer of insulating material may sometimes involve a tiny gap, which is commonly referred to as a void, during molding process of embedding electric conductors. This tiny gap causes corona discharge because of electric field formed by electric conductor energizing and possibly brings about electrically adverse effect. Further, there is a problem. Securing the insulating spacer on the flange of the cylindrical tank needs use of a plurality of through bolts; the through bolts disturb the uniformity of electric field around the outer periphery of the insulating spacer. To avoid this kind of harmful influence, a configuration has been employed in which a grounding shield that surrounds electric conductors as a whole is molded in the insulated spacer in one lump, and thereby, the electrical adverse effect attributable to tiny voids is prevented by the grounding shield.

It may be practicable to add a grounding shield in manufacturing the insulating spacer of Patent literatures 1 and 2. However, the simultaneous molding of electric conductors together with an optical fiber and further with a grounding shield integrally into one body does not sufficiently eliminate the electrical adverse effect attributable to tiny voids; this is a problem against an eased manufacturing.

An object of the present invention is to provide an insulating spacer with built-in optical fiber, which includes an optical fiber for current transformer use, having features such that manufacturing is easy and economical, such that corona discharges attributable to electric field concentration in tiny gaps will not be generated, and such that the properties of the current transformer will not be affected.

DISCLOSURE OF INVENTION

The present invention is characterized in that, in constituting an insulating spacer with built-in optical fiber by embedding in an insulating molded member molded as a single body with insulating material; at least one electric conductor; a grounding shield surrounding the electric conductor; an optical fiber of Faraday-effect element; the electric conductor, the grounding shield and the optical fiber, being embedded in the insulating molded member, and further the grounding shield is formed of a cylindrical shielding member, and the optical fiber is put in a certain place in the cylindrical shielding member.

Preferably, the cylindrical shielding member is characterized by being formed of a metal wire cylindrical member made of a helically wound metal wire.

Or, preferably, the cylindrical shielding member is characterized by being formed of a strip-metal cylindrical member made of strip-shaped metallic material, a metal-net cylindrical member made of metal wires, or a cylindrical metal member having a plurality of small holes perforated thereon.

ADVANTAGEOUS EFFECTS OF INVENTION

Since an optical-fiber-contained insulating spacer of the present invention is structured in a manner as stated above, the optical fiber of Faraday-effect element, which forms a current transformer, and the cylindrical shielding member can be molded being embedded in the insulating molded member; therefore, the invention has an advantage that manufacturing is easy and economical.

Further, the optical fiber of Faraday-effect element itself is arranged in the certain place in the cylindrical shielding member to be grounded. Therefore, even if a tiny void comes to exist in proximity to the optical fiber at the time of resin molding process of the insulating spacer, this configuration offers an advantage in that voltage applied to the electric conductor does not cause corona discharge, which is attributable to the concentration of electric field, near the cylindrical shielding member and does not affect the properties of the current transformer, because the cylindrical shielding member is being grounded.

BEST MODE OF CARRYING OUT THE INVENTION

The optical-fiber-contained insulating spacer of the present invention is formed by embedding in an insulating molded member molded as a single body by molding with using an insulating material at least one electric conductor, a grounding shield surrounding the electric conductor, and an optical fiber of Faraday-effect element. The grounding shield uses a cylindrical shielding member, and an optical fiber is arranged in approximate center thereof. The optical fiber to be build-in is used as a component of a current transformer for current measuring.

[Embodiment 1]

Figure 1:
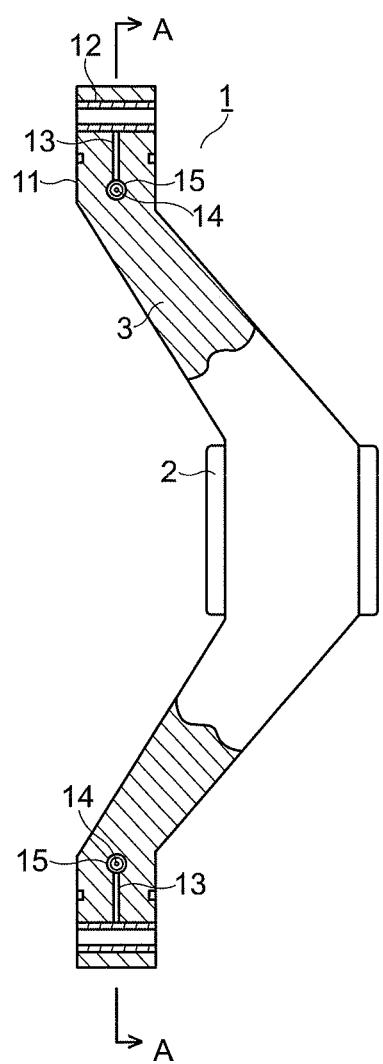
FIG. 1 is a partly sectioned schematic side view of an insulating spacer with built-in optical fiber that is an embodiment of the present invention.

The following provides a detailed explanation of an insulating spacer with built-in optical fiber of the present invention (hereinafter may be referred to as an insulating spacer, as the case may be) referring to FIG. 1 to FIG. 4. An insulating spacer 1 illustrated in FIG. 1 is for single-phase use. The insulating spacer 1 has an electric conductor 2 that provides electrical connection between center electric conductors in a cylindrical tank and an insulating molded member 3 that secures the electric conductor in position.

On a flange 11 formed on the outer periphery of the insulating molded member 3, a plurality of connection fitting 12 is disposed at regular intervals. The connection fittings 12 are embedded by molding insulating material such as epoxy resin to form the insulating molded member 3 of integrated one body having a disklike shape or a conical shape. The flange 11 of the insulating spacer 1 is sandwiched between flanges of the cylindrical tanks. The inside of each of the cylindrical tanks is partitioned by the insulating spacer 1.

Figure 2:
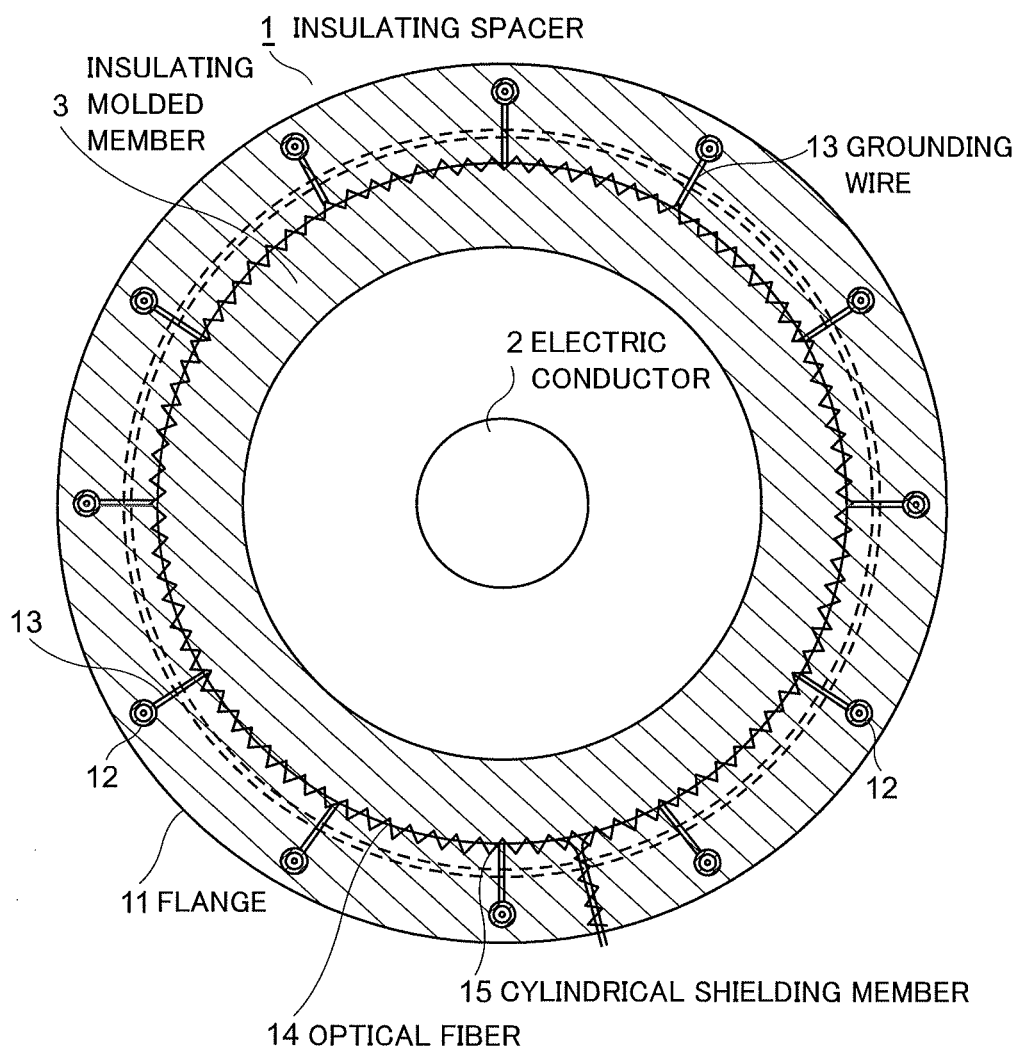
FIG. 2 is a sectional schematic view of the insulating spacer with built-in optical fiber illustrated in FIG. 1 when viewed from the line A-A in FIG. 1.
Figure 3:
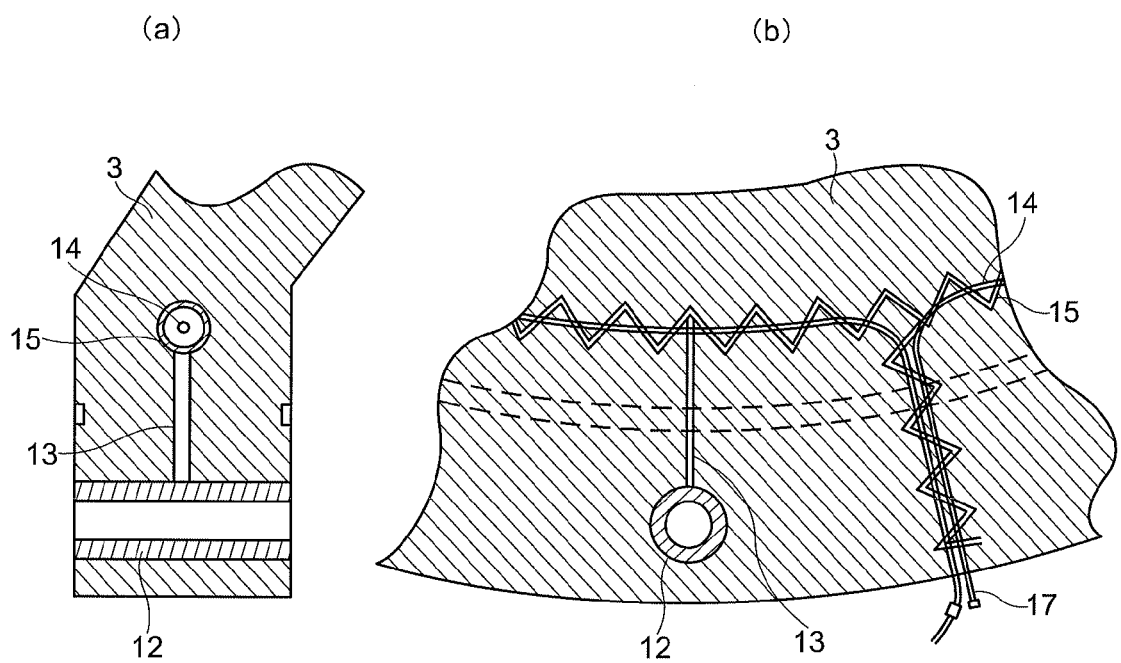
FIG. 3(a) is a sectional view of a part of the insulating spacer with built-in optical fiber illustrated in FIG. 1.
FIG. 3(b) is a sectional view of a part of the insulating spacer with built-in optical fiber illustrated in FIG. 2.

In the example illustrated in FIG. 1 to FIG. 3, an optical fiber 14 of the Faraday-effect element for use in a current transformer is disposed in proximity to the flange 11 of the insulating spacer 1 surrounding the electric conductor 2 and embedded in the insulating molded member 3. In this configuration, a grounding shield is formed of a cylindrical shielding member 15 and the optical fiber 14 is disposed at a certain place in the cylindrical shielding member 15, preferably in the proximity to the center thereof, in order that the distance between the optical fiber 14 and the electric conductor 2 will be maintained within a prescribed range. Thus, the insulating spacer 1 having such a construction as does not cause any adverse effect on the use in an optical current transformer, is provided.

The manner of fabricating the insulating spacer 1 by molding the cylindrical shielding member 15 and the optical fiber 14, which is to be disposed inside thereof, in the insulating molded member 3 embedding them is as follows: The optical fiber 14 is put in a state being supported in the certain place in the cylindrical shielding member 15 with a supporting member. The optical fiber 14 is easily supported in the certain place with a supporting member, because the cylindrical shielding member 15 is used.

The cylindrical shielding member 15 is connected to the connection fitting 12 through a grounding wire 13, which also works as a fixing wire, as illustrated in FIG. 1 to FIG. 3. Thereby, the cylindrical shielding member 15 establishes its electrical connection with the connection fitting 12 and is mechanically retained in the certain place; and such setup is placed within a molding tool. Thereafter, molding process is applied using insulating material such as epoxy resin to obtain the insulating spacer 1.

Figure 4:
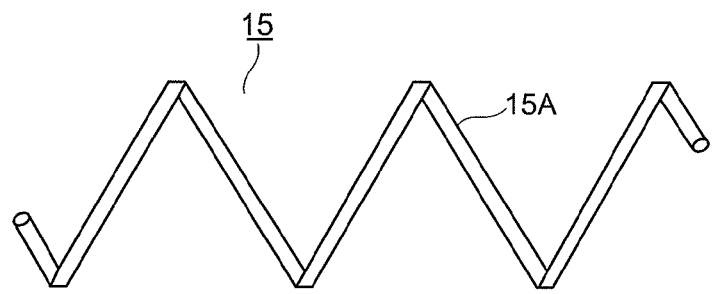
FIG. 4 is a schematic illustration of an example of the grounding shield to be used in the insulating spacer with built-in optical fiber illustrated in FIG. 1 and FIG. 2.

The cylindrical shielding member 15 uses a metal wire cylindrical member 15A formed of helically wound metal wire, as illustrated in FIG. 4 for example, having good workability such as copper wire or aluminum wire. As a matter of course, the metal wire to be used therefor should have such a thickness as is capable of maintaining a cylindrical shape as the cylindrical shielding member when formed in a helically wound shape.

The metal wire cylindrical member 15A formed by helically winding metal wire is structured in order to have a characteristics as a grounding shield and molded with insulating material with the optical fiber 14 being positioned inside thereof to complete forming the insulating molding member 3. Thereby, both the optical fiber 14 and the metal wire cylindrical member 15A are embedded in a certain place in the insulating molded member 3 and configured in order that the optical fiber 14 will be positioned at the distance within a prescribed range from the electric conductor 2.

In the example of arrangement of the optical fiber 14 illustrated in FIG. 2 and FIG. 3(b), the optical fiber 14 is installed being led out in order that both ends thereof will protrude from the insulating molded member 3 and the cylindrical shielding member 15, which works as the grounding shield, is provided on both of the led-out ends of the optical fiber 14.

Where the optical fiber 14 is used as a component of a reflection type current transformer, a mirror portion 17 is formed on one end of the optical fiber 14, and a light transmission side device and a light reception side device are arranged on the other end. Thereby, an optical current transformer is constituted. The optical fiber 14 is usable as a component of a transmission type device. In this usage, a light transmission side device is installed on one end of the optical fiber 14 and a light reception side device for current detection is arranged on the other end. Thereby, an optical current transformer is constituted.

By constituting the insulating spacer with built-in optical fiber in a manner as stated above, the insulating spacer 1 can be mold-formed with the optical fiber 14 for use in the optical current transformer arranged inside the cylindrical shielding member 15 that works as the grounding shield and with such arrangement embedded inside the insulating molded member 3; thereby, an insulating spacer can be manufactured easily and economically. Further, no adverse electrical effect will appear attributable to generation of corona discharge due to concentration of electric field at a tiny void caused by voltage applied on the electric conductor 2, since the optical fiber 14 itself is arranged in the certain place in the cylindrical shielding member 15 that is to be grounded. Accordingly, the properties of the optical current transformer will be given no damages.

[Embodiment 2]

Figure 5:
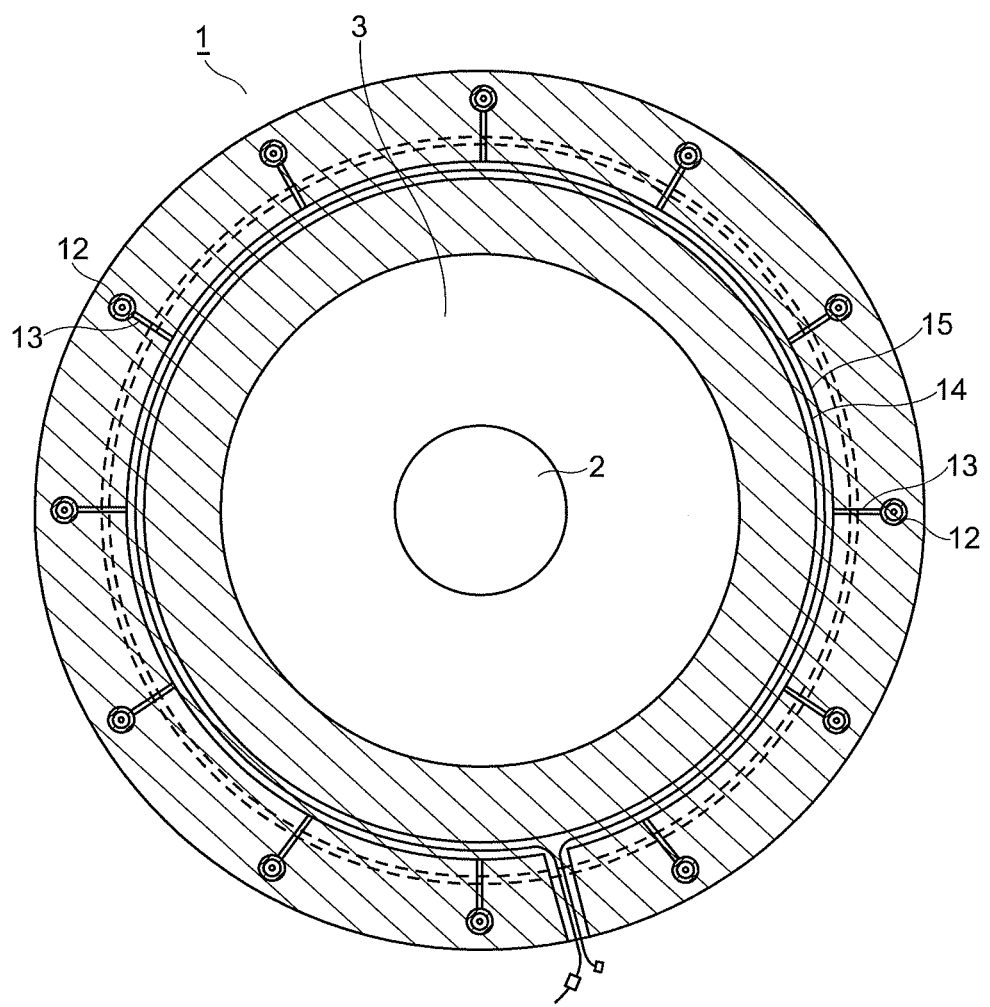
FIG. 5 is a sectional schematic view of another example of embodiment of the present invention when viewed the insulating spacer with built-in optical fiber illustrated in FIG. 1 from the line A-A in FIG. 1 .
Figure 6:
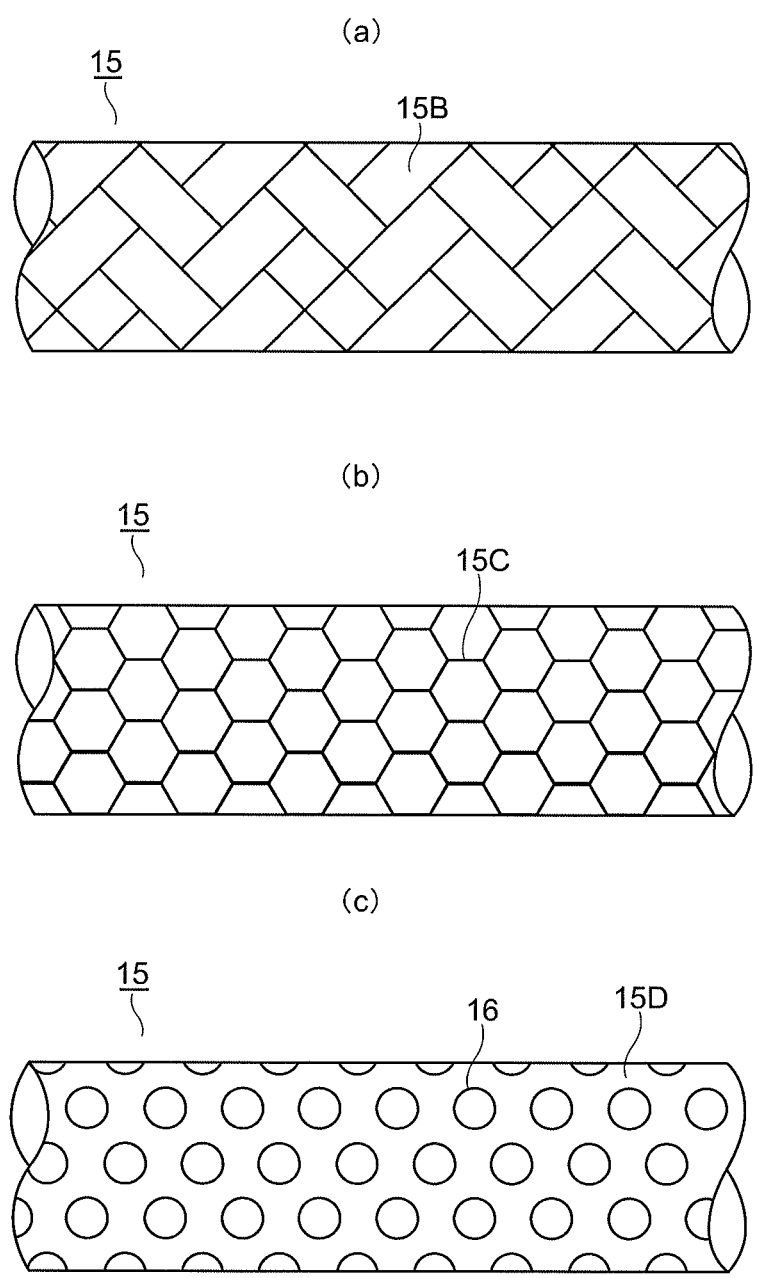
FIGS. 6(a) to 6(c) are schematic illustration of grounding shields each of which is to be used in the insulating spacer with built-in optical fiber illustrated in FIG. 5.

Next, an insulating spacer with built-in optical fiber 1 as another example of the present invention will be explained referring to FIG. 5 and FIG. 6. The insulating spacer 1 in this explanation is for single-phase use similarly to the example illustrated in FIG. 1 to FIG. 3 and has an electric conductor 2 and an insulating molded member 3 like the example stated previously. As FIG. 6(a) to FIG. 6(c) illustrate, a cylindrical shielding member 15 having a mechanically stout construction is used and an optical fiber 14 is arranged in the center thereof.

As the cylindrical shielding member 15, a strip-metal cylindrical member 15B made of strip-shaped metallic material is used in the example illustrated in FIG. 6(a), a metal-net cylindrical member 15C made of metal wires is used in the example illustrated in FIG. 6(b), and a cylindrical metal member 15D having a perforation 16 of a plurality of small holes thereon is used in the example illustrated in FIG. 6(c).

This insulating spacer with built-in optical fiber thus formed is capable of attaining a similar effect to that of the above-stated embodiment and does not incur large deformation in mold-forming the insulating molded member 3 using insulating material such as epoxy resin since the cylindrical shielding member 15 has a mechanically stout construction; this offers more eased manufacturing.

Explanation of each of the embodiments mentioned above has described on a single-phase insulating spacer as an example. The present invention is also applicable to a three-phase insulating spacer having such a configuration that three numbers of electric conductor 2 are arrayed in a parallel-flat style or in such an arrangement that lines linking the vertices thereof form an equilateral triangle or an isosceles triangle and are integrally molded into a single body of the insulating molded member 3. In this case, the optical fiber 14 and the cylindrical shielding member 15 are installed in order that the electric conductor 2 of each phase will be severally surrounded thereby and an overall shielding is provided in order that all the electric conductors 2 for three-phase are surrounded thereby in one lump, and they are molded using insulating material to form the insulating molded member 3.

The explanation stated above has described on an example in which the optical fiber 14 to be built-in the insulating molded member 3 is applied to an optical current transformer. It is obvious that the construction, in which the optical fiber 14 is arranged inside the cylindrical shielding member 15 followed by resin-molding to form the insulating spacer 1, is applicable to a zero-phase current transformer attaining a similar advantageous effect.

INDUSTRIAL APPLICABILITY

The invented insulating spacer with built-in optical fiber is suitable for a gas insulated switchgear of single-phase and three-phase, without any problems in use.

The invention claimed is:

1. An insulating spacer with built-in optical fiber comprising:
   an insulating molded member molded as a single body with insulating material;
   a connection fitting disposed on an outer periphery of the insulating molded member;
   at least one electric conductor;
   a grounding shield surrounding the electric conductor;
   a grounding wire; and
   an optical fiber of Faraday-effect element; wherein:
   the electric conductor, the grounding shield, and the optical fiber are embedded in the insulating molded member, and
   the grounding shield is formed of a cylindrical shielding member, the optical fiber is put in a certain place in the cylindrical shielding member, and the grounding shield is connected to the connection fitting through the grounding wire.

2. The insulating spacer with built-in optical fiber according to claim 1, wherein the cylindrical shielding member is formed of a metal wire cylindrical member made of a helically wound metal wire.

3. The insulating spacer with built-in optical fiber according to claim 1, wherein the cylindrical shielding member is formed of a strip-metal cylindrical member made of strip-shaped metallic material.

4. The insulating spacer with built-in optical fiber according to claim 1, wherein the cylindrical shielding member is formed of a metal-net cylindrical member made of metal wires.

5. The insulating spacer with built-in optical fiber according to claim 1, wherein the cylindrical shielding member is formed of a cylindrical metal member having a plurality of small holes perforated thereon.

* * * * *